(12) United States Patent
Mahgerefteh et al.

(10) Patent No.: US 11,435,522 B2
(45) Date of Patent: Sep. 6, 2022

(54) GRATING COUPLED LASER FOR SI PHOTONICS

(71) Applicant: Finisar Corporation, Sunnyvale, CA (US)

(72) Inventors: Daniel Mahgerefteh, Los Angeles, CA (US); Shiyun Lin, San Diego, CA (US); Yasuhiro Matsui, Milpitas, CA (US); Ding Wang, Fremont, CA (US); David Bruce Young, Oakland, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 16/569,486

(22) Filed: Sep. 12, 2019

(65) Prior Publication Data

US 2020/0081204 A1 Mar. 12, 2020

Related U.S. Application Data

(60) Provisional application No. 62/730,444, filed on Sep. 12, 2018.

(51) Int. Cl.
*G02B 6/12* (2006.01)

(52) U.S. Cl.
CPC ..... *G02B 6/12002* (2013.01); *G02B 6/12007* (2013.01)

(58) Field of Classification Search
CPC ........ G02B 6/34; G02B 6/124; G02B 6/4215; G02B 2006/12107

(Continued)

(56) References Cited

U.S. PATENT DOCUMENTS 4,919,507 A * 4/1990 Evans .............. G02B 6/34
385/130
5,003,550 A 3/1991 Welch
(Continued)

FOREIGN PATENT DOCUMENTS

CN 102159975 A 8/2011
CN 103430064 A 12/2013
(Continued)

OTHER PUBLICATIONS

International Search Report and Written Opinion dated Mar. 20, 2017 in related PCT Application No. PCT/US2016/067634 (16 pages).

(Continued)

*Primary Examiner* — Robert Tavlykaev
(74) *Attorney, Agent, or Firm* — Blank Rome LLP

(57) ABSTRACT

A grating coupled laser (GCL) includes an active section and a passive section. The passive section is butt coupled to the active section to form a butt joint with the active section. The active section includes an active waveguide. The passive section includes a passive waveguide, a transmit grating coupler, and a top cladding. The passive waveguide is optically coupled end to end with the active waveguide and includes a first portion and a second portion. The first portion of the passive waveguide is positioned between the second portion of the passive waveguide and the active waveguide. The transmit grating coupler is optically coupled to the passive waveguide and includes grating teeth that extend upward from the second portion of the passive waveguide. The top cladding is positioned directly above the first portion of the passive waveguide and is absent directly above at least some of the transmit grating coupler.

16 Claims, 6 Drawing Sheets

(58) Field of Classification Search
USPC .................................................... 385/14, 37
See application file for complete search history.

(56) References Cited

U.S. PATENT DOCUMENTS

| | | | |
|---|---|---|---|
| 6,118,915 | A | 9/2000 | Sato |
| 6,282,219 | B1 | 8/2001 | Butler et al. |
| 6,730,944 | B1 | 5/2004 | Tandon et al. |
| 7,194,016 | B2 | 3/2007 | Bullington |
| 7,327,771 | B2* | 2/2008 | Kim .................. G02B 6/12004 |
| | | | 372/50.1 |
| 7,532,784 | B2 | 5/2009 | Tolshikhin |
| 8,041,164 | B2 | 10/2011 | Granestrand |
| 8,267,583 | B2 | 9/2012 | Yao et al. |
| 8,503,841 | B2 | 8/2013 | Kopp et al. |
| 8,660,391 | B1 | 2/2014 | Fish |
| 8,837,885 | B2 | 9/2014 | Seo et al. |
| 9,031,365 | B2 | 5/2015 | Park et al. |
| 9,091,827 | B2 | 7/2015 | Versiegers et al. |
| 9,176,291 | B2 | 11/2015 | Li et al. |
| 9,405,066 | B2 | 8/2016 | Mahgerefteh et al. |
| 9,613,886 | B2 | 4/2017 | Lin |
| 9,715,064 | B1 | 7/2017 | Gambino et al. |
| 10,243,322 | B2 | 3/2019 | Mahgerefteh |
| 10,317,632 | B2 | 6/2019 | Mahgerefteh |
| 2002/0131668 | A1* | 9/2002 | Marsh ..................... H01S 5/026 |
| | | | 385/14 |
| 2002/0176463 | A1* | 11/2002 | Bullington ............... H01S 5/187 |
| | | | 372/45.01 |
| 2003/0081902 | A1 | 5/2003 | Blauvelt et al. |
| 2004/0156589 | A1* | 8/2004 | Gunn ..................... G02B 6/124 |
| | | | 385/37 |
| 2004/0240767 | A1 | 12/2004 | Kimura et al. |
| 2005/0147355 | A1 | 7/2005 | Ilchenko |
| 2005/0232547 | A1* | 10/2005 | Boudreau ............... B81C 3/002 |
| | | | 385/52 |
| 2006/0062537 | A1* | 3/2006 | Ranganath ......... G02B 6/12004 |
| | | | 385/131 |
| 2007/0279634 | A1 | 12/2007 | Gruhlke et al. |
| 2009/0003762 | A1 | 1/2009 | Chiniwalla et al. |
| 2009/0297093 | A1 | 12/2009 | Webster et al. |
| 2009/0324163 | A1 | 12/2009 | Dougherty et al. |
| 2010/0006784 | A1 | 1/2010 | Mack et al. |
| 2010/0245987 | A1* | 9/2010 | Hasegawa ................. H01S 5/50 |
| | | | 359/341.3 |
| 2011/0091157 | A1 | 4/2011 | Yao et al. |
| 2012/0093456 | A1 | 4/2012 | Taillaert et al. |
| 2012/0201491 | A1* | 8/2012 | Zhou ..................... G11B 5/314 |
| | | | 385/14 |
| 2012/0307857 | A1* | 12/2012 | Oh ........................ H01L 33/005 |
| | | | 438/31 |
| 2012/0328234 | A1 | 12/2012 | Lu et al. |
| 2013/0032281 | A1 | 2/2013 | Van Den Berg et al. |
| 2013/0259077 | A1 | 10/2013 | Bakir et al. |
| 2013/0322813 | A1 | 12/2013 | Grondin et al. |
| 2014/0140655 | A1 | 5/2014 | Chakravarty et al. |
| 2014/0140659 | A1* | 5/2014 | Demaray ............... C23C 14/044 |
| | | | 385/28 |
| 2014/0153605 | A1* | 6/2014 | Arimoto ............... G02B 6/4206 |
| | | | 372/50.11 |
| 2014/0270620 | A1 | 9/2014 | Anderson et al. |
| 2015/0063753 | A1 | 3/2015 | Evans et al. |
| 2015/0117808 | A1* | 4/2015 | Chen ..................... G02F 1/025 |
| | | | 385/2 |
| 2015/0177459 | A1 | 6/2015 | Van Campenhout et al. |
| 2015/0205062 | A1 | 7/2015 | Collins |
| 2015/0260913 | A1* | 9/2015 | Li ........................... H01S 5/10 |
| | | | 385/14 |
| 2015/0260994 | A1 | 9/2015 | Akutsu et al. |
| 2015/0286008 | A1 | 10/2015 | Shimizu et al. |
| 2015/0316720 | A1 | 11/2015 | Yang et al. |
| 2015/0338577 | A1 | 11/2015 | Shi et al. |
| 2016/0018601 | A1 | 1/2016 | Gardes et al. |
| 2016/0047983 | A1 | 2/2016 | Collins et al. |
| 2016/0238793 | A1 | 8/2016 | Frankel et al. |
| 2016/0246009 | A1 | 8/2016 | Jiang |
| 2016/0294155 | A1 | 10/2016 | Zheng et al. |
| 2016/0356956 | A1 | 12/2016 | Davoine et al. |
| 2017/0075063 | A1 | 3/2017 | Brouckaert et al. |
| 2017/0179680 | A1* | 6/2017 | Mahgerefteh ......... H01S 5/3013 |
| 2017/0207600 | A1* | 7/2017 | Klamkin ............. G02B 6/12002 |
| 2019/0302360 | A1* | 10/2019 | Saito ................... G02B 6/2726 |

FOREIGN PATENT DOCUMENTS

| | | |
|---|---|---|
| EP | 0389172 A2 | 9/1990 |
| EP | 0561672 A1 | 9/1993 |
| EP | 0 623 980 A2 | 11/1994 |
| EP | 2664949 A2 | 11/2013 |
| JP | 6484776 A | 3/1989 |
| JP | 02-195309 | 8/1990 |
| JP | H105 216079 A | 8/1993 |
| JP | 2000310750 A | 11/2000 |
| JP | 2003-510656 | 3/2003 |
| JP | 2003255166 A | 9/2003 |
| JP | 2003-282569 | 10/2003 |
| JP | 2005-115117 | 4/2005 |
| JP | 2006-023385 | 1/2006 |
| JP | 2006/047462 | 2/2006 |
| JP | 2007-052328 | 3/2007 |
| JP | 2011203604 A | 10/2011 |
| JP | 2013251394 A | 12/2013 |
| JP | 2014-081587 | 5/2014 |
| JP | 2014-191301 | 10/2014 |
| JP | 2015118372 A | 6/2015 |
| KR | 20130104838 A | 9/2013 |
| WO | 2001/088577 A1 | 11/2001 |
| WO | 2009/106139 A1 | 9/2009 |
| WO | 2009/106140 A1 | 9/2009 |
| WO | 2010/033435 A2 | 3/2010 |
| WO | 2012/125267 A1 | 9/2012 |
| WO | 2014/112077 | 7/2014 |
| WO | 2015063628 A1 | 5/2015 |
| WO | 2016/011002 A1 | 1/2016 |
| WO | 2017/106880 A1 | 6/2017 |

OTHER PUBLICATIONS

J.H. Abeles et al., "Monolithic High-Power InGaAs/AlGaAs Grating Surface Emitting Fanned-Out Amplifier-Lasers Emitting Monochromatic High-Quality Beams," LEOS '92 Conference Proceedings, Boston, MA, USA, 1992, pp. 521-522.

International Search Report and Written Opinion dated Jul. 12, 2019, in related PCT Application No. PCT/US2019/031181.

International Search Report and Written Opinion dated Mar. 9, 2018, in related PCT Application No. PCT/US2017/064959 (14 pages).

International Search Report and Written Opinion, as issued in connection with International Patent Application No. PCT/US2015/060224, dated May 13, 2016, 11 pgs.

International Search Report and Written Opinion, as issued in connection with International Patent Application No. PCT/US2015/060223, dated May 23, 2016, 13 pgs.

European Communication, as issued in connection with European Application No. 15801046.2, dated Jun. 23, 2017, 2 pgs.

European Communication, as issued in connection with European Application No. 15797781.0, dated Jun. 27, 2017, 2 pgs.

Korean Preliminary Rejection, as issued in connection with Korean Application No. 10-2017-7016051, dated Jul. 18, 2017, 12 pgs.

Korean Preliminary Rejection, as issued in connection with Korean Application No. 10-2017-7016051, dated Nov. 16, 2017, 6 pgs.

Korean Preliminary Rejection, as issued in connection with Korean Application No. 10-2017-7016050, dated Jun. 12, 2018, 22 pgs.

Shani et al., "Integrated Optic Adiabatic Polarization Splitter on Silicon", Applied Physics Letters, American Institute of Physics, vol. 56, No. 2, Jan. 8, 1990, pp. 120-121.

(56) References Cited

OTHER PUBLICATIONS

Shani et al., "Integrated Optic Adiabatic Devices on Silicon", IEEE Journal of Quantum Electronics, vol. 27, No. 3, Mar. 1991, pp. 556-566.

* cited by examiner

GRATING COUPLED LASER FOR SI PHOTONICS

CROSS-REFERENCE TO RELATED APPLICATION

This patent application claims the benefit of and priority to U.S. Provisional App. No. 62/730,444 filed Sep. 12, 2018. The 62/730,444 application is incorporated herein by reference.

This patent application is related to U.S. Pat. No. 10,243,322 issued Mar. 26, 2019, U.S. Pat. No. 10,317,632 issued Jun. 11, 2019, U.S. patent application Ser. No. 15/977,907 filed May 11, 2018, and U.S. Patent Pub. No. 2019/0207362 published Jul. 4, 2019. The U.S. Pat. No. 10,243,322 patent, the U.S. Pat. No. 10,317,632 patent, the Ser. No. 15/977,907 application, and the 2019/0207362 publication are incorporated herein by reference.

FIELD

The embodiments discussed herein are related to a grating coupled laser (GCL) for silicon (Si) photonics.

BACKGROUND

Unless otherwise indicated herein, the materials described herein are not prior art to the claims in the present application and are not admitted to be prior art by inclusion in this section.

Coupling light from single mode edge emitting lasers to Si photonics is costly, as it generally requires two lenses and a large isolator block. In systems that include such lasers and Si photonics, alignment tolerances may be less than 0.5 micrometers ($\mu$m). Such low alignment tolerances typically require active alignment to be met.

The subject matter claimed herein is not limited to implementations that solve any disadvantages or that operate only in environments such as those described above. Rather, this background is only provided to illustrate one example technology area where some implementations described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate to GCLs for Si photonics.

In an example embodiment, a GCL includes an active section and a passive section. The passive section is coupled to the active section to form an interface with the active section. The active section includes an active waveguide. The passive section includes a passive waveguide, a transmit grating coupler, and a top cladding. The passive waveguide is optically coupled end to end with the active waveguide and includes a first portion and a second portion. The first portion of the passive waveguide is positioned between the second portion of the passive waveguide and the active waveguide. The transmit grating coupler is optically coupled to the passive waveguide and includes grating teeth that extend upward from the second portion of the passive waveguide. The top cladding is positioned directly above the first portion of the passive waveguide and is absent directly above at least some of the transmit grating coupler.

In another example embodiment, a system includes a GCL and a photonic integrated circuit (PIC). The GCL includes an active section with an active waveguide and a passive section coupled to the active section to form an interface with the active section. The passive section includes a passive waveguide, a transmit grating coupler, and a top cladding. The passive waveguide is optically coupled end to end with the active waveguide and includes a first portion and a second portion. The first portion of the passive waveguide is positioned between the second portion of the passive waveguide and the active waveguide. The transmit grating coupler is optically coupled to the passive waveguide and includes grating teeth that extend upward from the second portion of the passive waveguide. The top cladding is positioned directly above the first portion of the passive waveguide and is absent directly above at least some of the transmit grating coupler. The PIC is positioned below the GCL. The PIC includes a PIC waveguide and a receive grating coupler optically coupled to the PIC waveguide. The receive grating coupler of the PIC is optically coupled to the transmit grating coupler of the passive waveguide of the GCL.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Figure 1A:
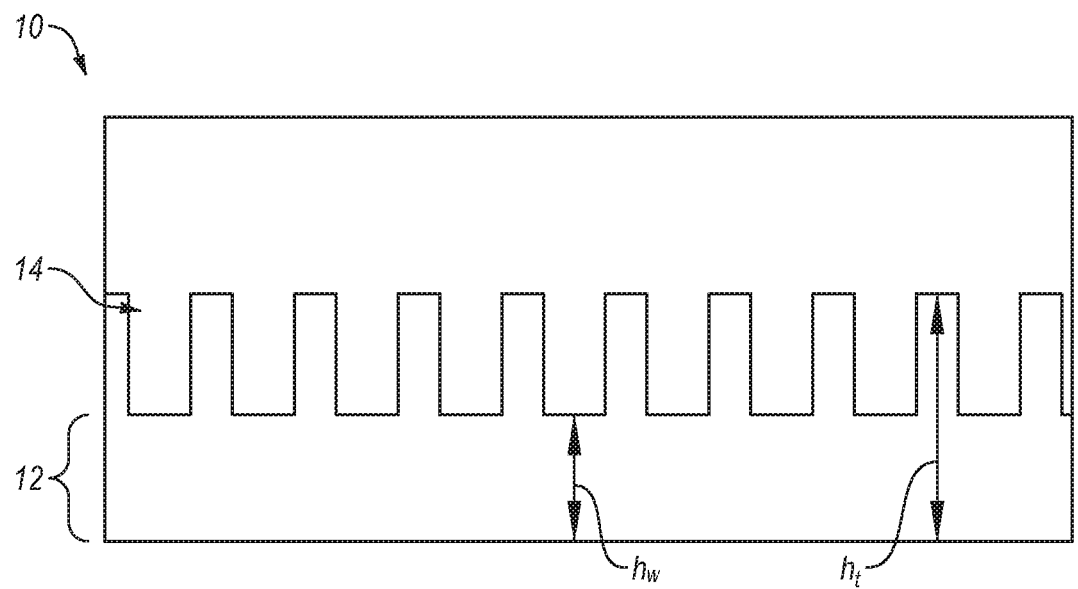
FIG. 1A illustrates an example grating coupler.

Coupling light from laser to Si is challenging due to small waveguide sizes, disparate yield and reliability, and the presence of an optical isolator in between the laser and the Si, delaying wide spread adoption of Si photonics in data communications.

Heterogeneous laser integration alleviates the alignment of an indium phosphide (InP) waveguide of an InP laser with a Si waveguide of a Si PIC, has low coupling loss and is very compact. However, heterogeneous laser integration reduces typically very high yield of the Si PICs to the single-mode and burn-in yields of the InP lasers, which tend to be much worse than that of Si. The bonding of InP on Si is also not widely available as it is not in the tool kits of complementary metal-oxide-semiconductor (CMOS) fabs.

Flip chipping a laser and direct butt coupling to a Si waveguide of a Si PIC is a complicated process requiring mechanical precisions of 200 nanometers (nm), and control of solder volume. Also, individual InP die must be burned in after attachment to the Si PIC, if burn-in is required, potentially reducing yield of the resulting assembly.

In addition, neither heterogeneous integration or butt-coupling allow insertion of an optical isolator between laser and the Si PIC. An optical isolator may help achieve the low relative intensity noise (RIN) for 400 gigabit per second (Gb/s) and higher rates or for coherent communications in which the laser linewidth is extremely sensitive to external back reflection. Laser in Si micro-package (LaMP) allows separate yield and burn-in of the laser and insertion of an optical isolator, but still requires the Si package and micro-optics assembly and is difficult to miniaturize due to the working distance of the lens needed to magnify the laser mode to match the Si grating in the Si PIC.

Some embodiments described herein may include a monolithic InP distributed feedback (DFB) laser with an integrated diffraction grating. The laser may be referred to as a GCL. The integrated diffraction grating may be referred to as a transmit grating coupler. The GCL may generate a large ~30 μm spot and may couple the light through its substrate. The resulting small ~2° divergence angle of the GCL may allow direct coupling to a grating in the Si PIC with ~2-3 μm placement accuracy and the insertion of an optical isolator without lenses with 4-5 decibels (dB) loss. The grating in the Si PIC may be referred to as a receive grating coupler.

Accordingly, some embodiments may omit lenses, which may reduce part count and cost, and significantly simplify packaging processes in such systems. The absence of lenses in such systems may significantly reduce the size and cost of the isolator (when included) and may significantly increase alignment tolerances. For example, the alignment tolerance may be increased by a factor of 10 or even 50 or more from about 0.1 μm which has to be done by active feed-back alignment, which requires turning on the laser during alignment, to about 1-2 μm or more, e.g., 5-8 μm or even more achieved in a passive alignment pick-and place machine; i.e. without having to turn on the GCL. Alternatively or additionally, embodiments described herein may enable wafer level testing of the GCL.

In some embodiments, the GCL die may be mounted on a simple substrate and individually tested and burned in before assembly on the Si PIC. In an example, the GCL may be an InP GCL mounted on a submount, which in turn is mounted on the Si PIC. The submount may include Si or aluminum nitride (AlN). At least a portion of a passive section of the GCL that includes the transmit grating coupler may extend beyond the submount, e.g., in a cantilever manner, with an optical isolator positioned adjacent to the submount and/or between the transmit grating coupler and a receive grating coupler of the Si PIC. Light generated in an active section of the GCL may be emitted horizontally and may be coupled out of the GCL in a direction with a vertical component, e.g., through a substrate of the GCL, by the transmit grating coupler. The light may pass through the optical isolator and couple directly to the receive grating coupler in the Si PIC. The receive grating coupler may include a silicon nitride (SiN) grating in the Si PIC that couples the light to a SiN waveguide in the Si PIC. In some embodiments, the Si PIC may include a mirror at least beneath the SiN grating to improve directionality. The mirror may include a thin (e.g., 50 nanometers) layer of Si or other suitable layer. Light from the SiN waveguide may be adiabatically coupled to a Si waveguide in the Si PIC with low loss. Parallelism of top and bottom surfaces of the InP GCL, a thin metal bond between the GCL and submount and mechanical stand-offs in the submount or Si PIC may guarantee and/or facilitate a small 0.3° angle assembly tolerance for the large 30 μm laser mode. A heat sink connected to the top of the submount may remove heat from GCL.

More generally, according to this and other embodiments, a surface coupled system may include a transmit grating coupler and a receive grating coupler. The grating couplers may couple light from an edge emitting laser to a PIC, such as a Si PIC. In some embodiments, the transmit and receive grating couplers may each include a small index contrast long surface grating. In general, a small index contrast long surface grating may include a surface grating with an index contrast less than about 1-1.5 and a length greater than 10 μm. In some embodiments, the transmit and receive grating couplers may each include a larger area surface grating (LASG) with a length greater than about 10 μm and with or without small index contrast.

The edge emitting laser may include an InP laser or other suitable edge emitting laser. The InP laser may include a passive waveguide, also referred to as a first waveguide, that expands in a fan out region to the transmit grating coupler. The transmit grating coupler may be configured to generate a relatively large optical mode spot size of about 8-40 μm for an optical beam diffracted by the transmit grating coupler. Such an edge emitting laser formed in the same chip with a transmit grating coupler may be referred to herein as a grating coupled laser or GCL. As used herein, "transmit grating coupler" may generally refer to one or more diffraction gratings included in a passive section of a GCL which diffracts light from a laser cavity of the GCL out of plane. In particular, the diffraction gratings may diffract the light in a direction that has a component that is orthogonal to the propagation direction within the laser cavity of the GCL and towards the Si PIC.

The first waveguide of the GCL may include a core with a core index of refraction, a top cladding with a top cladding index of refraction, and a substrate as a bottom cladding with a bottom cladding index of refraction. The transmit grating coupler may include grating teeth formed on the core of the first waveguide, e.g., extending upward from the first waveguide. The grating teeth may each have a total height, a height above the core of the first waveguide, a period, and a duty cycle. In some embodiments, the core index of refraction may be greater than a first threshold value so that an effective index of the first diffraction grating is sufficiently higher than the bottom cladding index to avoid leakage of a diffracted optical mode into the substrate.

The receive grating coupler may be formed in the Si PIC. The receive grating coupler may be configured to receive the optical beam diffracted by the transmit grating coupler and to redirect the optical beam into a waveguide of the Si PIC, which waveguide may be referred to as a second waveguide to distinguish it from the first waveguide of the grating coupled laser. As used herein, "receive grating coupler" may generally refer to one or more diffraction gratings included in the Si PIC which receives the light from the transmit grating coupler and directs it into the second waveguide in the Si PIC.

In an embodiment, the receive grating coupler may have a relatively large optical mode size of about 30 µm. More generally, the optical mode size of the receive grating coupler may be in a range from 20 µm to 40 µm, or even less than 20 µm or more than 40 µm.

In an embodiment, the optical mode of the receive grating coupler may match or substantially match the optical mode of the light received from the GCL. For example, the optical mode of the receive grating coupler may overlap the optical mode of the light received from the GCL by at least 50%.

In an embodiment, the receive grating coupler may have a coupling efficiency of 0.5 to 3 decibels (dB) for incident light from the GCL. Alternatively or additionally, the incident light from the GCL may have a Gaussian mode with an optical mode size of about 30 µm. More generally, the optical mode size of the incident light from the GCL may be in a range from 20 µm to 40 µm, or even less than 20 µm or more than 40 µm.

Either or both of the transmit and receive grating couplers may be a uniform grating and/or an apodized grating. Alternatively or additionally, either or both of the transmit and receive grating couplers may be at least one of a positive angle grating, a negative angle grating, a straight grating (e.g., a grating with straight grating lines), a curved grating (e.g., a grating with curved grating lines), an angled grating, and/or a non-angled grating.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Figure 1B:
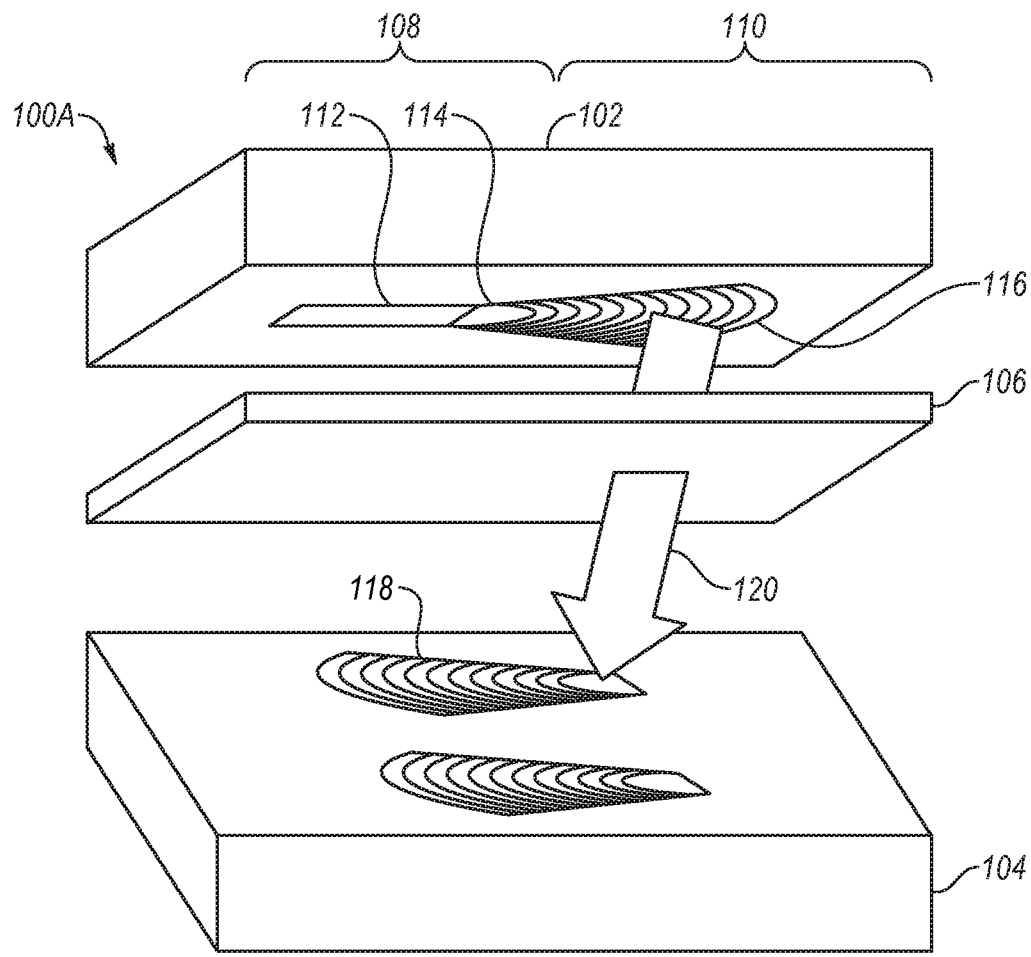
FIGS. 1B and 1C illustrate example surface coupled systems.
Figure 1C:
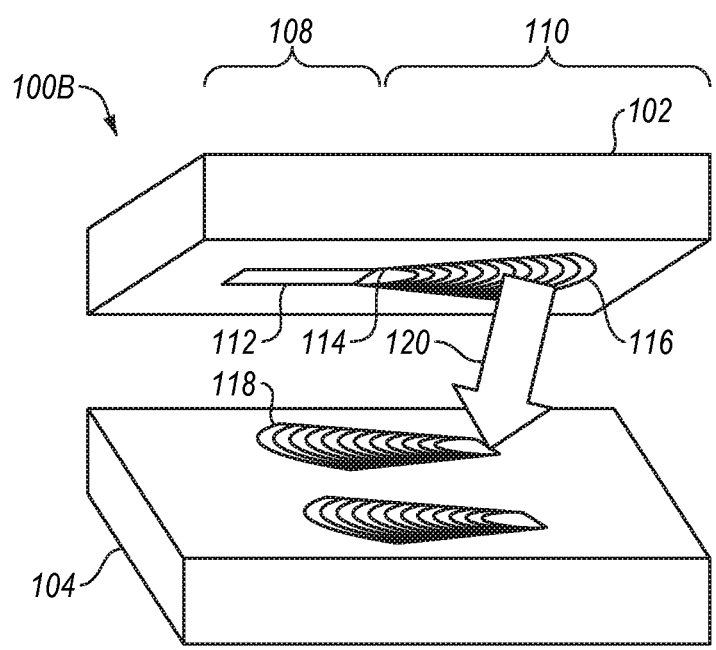

FIG. 1A illustrates an example grating coupler 10, arranged in accordance with at least one embodiment described herein. The grating coupler 10 includes a waveguide 12 and grating teeth 14 that extend upward from the waveguide 12. The waveguide 12 has a height $h_w$ and the grating teeth 14 each has a height $h_t$. The grating coupler 10 may be implemented as a transmit grating coupler or a receive grating coupler FIGS. 1B and 1C illustrate example surface coupled systems 100A and 100B (collectively "systems 100"), arranged in accordance with at least one embodiment described herein. As illustrated, the surface coupled systems 100 may each include a GCL 102 and a PIC 104. In FIGS. 1B and 1C, the GCL 102 may include an InP laser and the PIC 104 may include a Si PIC. The surface coupled system 100A of FIG. 1B may additionally include an optical isolator 106 (hereinafter "isolator 106") disposed between the GCL 102 and the Si PIC 104. In other embodiments, the isolator 106 may be omitted; for example, the surface coupled system 100B of FIG. 1C omits the isolator 106.

The GCL 102 may include an active section 108 and a passive section 110 coupled to the active section 108 to form an interface. The active section 108 may include a laser cavity and/or active waveguide 112. The passive section 110 may include a passive waveguide 114 optically coupled to the active waveguide 112 and a transmit grating coupler 116 optically coupled to the passive waveguide 114. The transmit grating coupler 116 may include, e.g., partially etched grating teeth that extend upward from a top of the passive waveguide 114, where a total height of the grating teeth measured from a bottom of the passive waveguide 114 to a top of the grating teeth is greater than a total height of the passive waveguide 114. Alternatively, the total height of the grating teeth may equal a total height of the passive waveguide 114, e.g., by etching downward into a portion of the passive waveguide 114 to form the grating teeth. Alternatively or additionally, the transmit grating coupler 116 may include fully etched grating teeth arranged inline with the passive waveguide 114.

The active section 108 of the GCL 102 may have any suitable configuration. For example, the active section 108 may include a distributed Bragg Reflector (DBR) laser cavity including a gain medium positioned between front and rear DBR mirrors. As another example, the active section 108 may include a DFB arrangement in which a grating and a gain medium overlap in the laser cavity. As still another example, the active section 108 may include a DFB type gain region positioned between and/or inline with one or more passive DBR mirrors, which may be termed a Distributed Reflector (DR) laser.

The PIC 104 may include a receive grating coupler 118 and a PIC waveguide (not shown in FIGS. 1B and 1C). The receive grating coupler 118 may be optically coupled to the PIC waveguide and may include grating teeth, e.g., that extend above the PIC waveguide, that are formed in the PIC waveguide, and/or that are inline with the PIC waveguide.

Light emitted by a gain medium of the GCL 102, e.g., that may be included in the laser cavity of the active waveguide 112, may propagate through the active waveguide 112 to the passive waveguide 114. The passive waveguide 114 may include a fanout region within and/or to which the transmit grating coupler 116 is formed.

The light emitted from the active section 112 of the GCL 102 may travel through the active waveguide 112 to the passive waveguide 114 and the fan out region, where a mode of the light may be expanded laterally (e.g., generally in and out of the page in FIGS. 1B and 1C). The transmit grating coupler 116 may diffract the light with the laterally expanded mode generally downward as diffracted light 120. The diffracted light 120 may be diffracted toward the receive grating coupler 118 of the PIC 104. The mode of the diffracted light 120 may be expanded to a 8-40 µm spot size (lateral measurement) within the fan out region while simultaneously being expanded along the direction of the active section 112 by the transmit grating coupler 116. One potential benefit of this method of expanding diffracted light may be that the spot size may be much larger than the 2 to 4 µm spot size that can be achieved with standard spot size converters.

The diffracted light 120 may be received by the receive grating coupler 118. The diffracted light 120 may be redirected by the receive grating coupler 118 into the PIC waveguide (not illustrated) of the PIC 104. The PIC waveguide of the PIC 104 may include a Si waveguide, a SiN waveguide, or other suitable waveguide.

In the surface coupled system 100A of FIG. 1B, the diffracted light 120 passes through the isolator 106 before reaching the receive grating coupler 118 of the PIC 104. The isolator 106 may be configured to reduce or eliminate back reflection. The isolator 106 may be attached to the PIC 104, or to the GCL 102, or to both the PIC 104 and the GCL 102, or to some other component(s).

In the surface coupled system 100B of FIG. 1C, there is no isolator and the diffracted light 120 passes directly to the receive grating coupler 118 of the PIC 104.

One or both of the transmit grating coupler 116 and the receive grating coupler 118 may be implemented in the same or similar manner as the grating coupler 10 of FIG. 1A.

Figure 2:
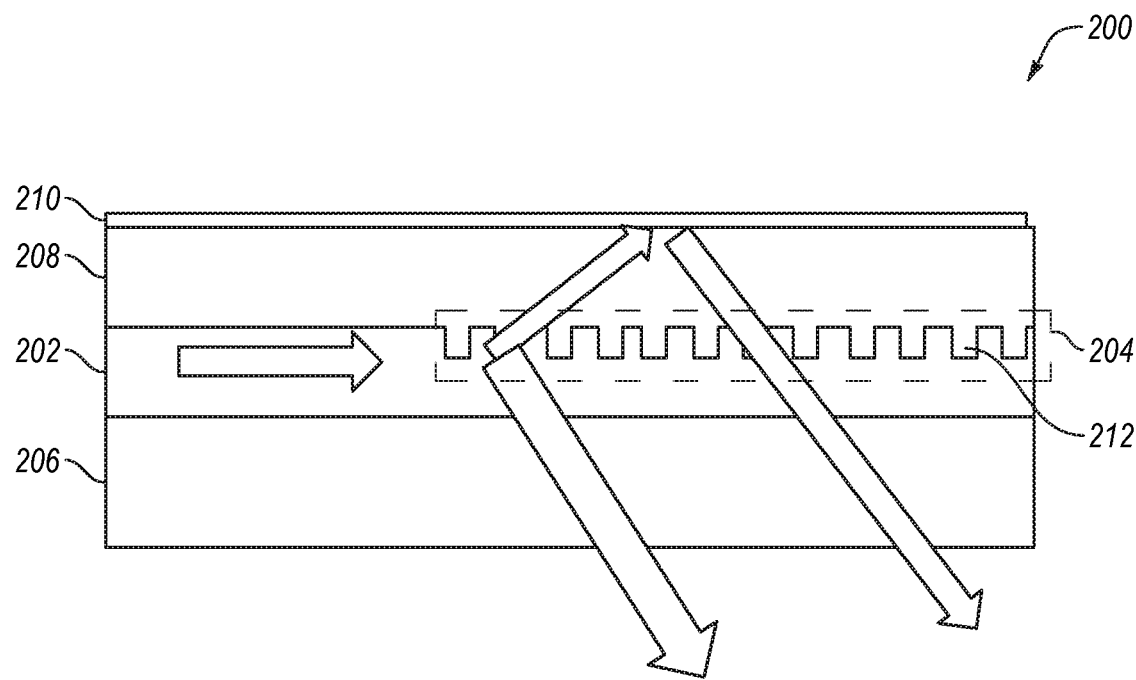
FIG. 2 illustrates a passive section of an example GCL.

FIG. 2 illustrates a passive section 200 of an example GCL, arranged in accordance with at least one embodiment described herein. The passive section 200 may include or correspond to the passive section 114 of FIGS. 1B and 1C. The GCL that includes the passive section 200 of FIG. 2 may be implemented in one or more of the surface coupled systems discussed herein.

The passive section 200 may include a passive waveguide 202 made up of a core and cladding and that is optically coupled to a transmit grating coupler 204, which may respectively correspond to or include the passive waveguides and transmit grating couplers discussed elsewhere herein. The passive section 200 may also include a substrate 206 beneath the passive waveguide 202 and the transmit grating coupler 204, a top cladding 208 above the passive waveguide 202 and the transmit grating coupler 204, and a top mirror 210 above the top cladding 208. The substrate 206 may serve as cladding to the passive waveguide 202. In at least one embodiment, the passive waveguide 202 may include an InGaAsP waveguide. Some embodiments of a GCL may include a top mirror such as the top mirror 210 while other embodiments may omit the top mirror.

The transmit grating coupler 204 may include a periodic structure 212 formed at an interface between the passive waveguide 202 and the top cladding 208. The periodic structure 212 may include a corrugated region that includes regions of passive waveguide 202 that alternates with regions of top cladding 208. The regions of passive waveguide 202 may have an index of refraction that is different than an index of refraction for the regions of top cladding 208. The periodic regions may be called corrugations or teeth. The extent of each corrugation or tooth laterally (e.g., in and out of the page) may be referred to as a grating line. The periodic structure 212 may expand laterally (e.g., in and out of the page) in the light propagation direction (e.g., from left to right), e.g., in the form of a fan out region.

The top cladding 208 may include $SiO_2$, or SiNx or other suitable dielectric passivation materials. The top mirror 210 may include gold, a dielectric stack (e.g., HR coating), or other suitable material and/or mirror. The substrate 206 may include InP or other suitable cladding material.

Although not illustrated in FIG. 2, a GCL that includes the passive section 200 may additionally include an active section that includes a gain medium and one or more DBR mirrors or DFB reflectors that collectively form a laser cavity optically coupled to the passive waveguide 202. The passive section 200 may be butt coupled to the active section or formed with the active section by quantum well intermixing (QWI).

The passive section 200 may be configured to maximize a fraction of light diffracted by the transmit grating coupler 204 downward through the substrate 206. Additionally, the passive section 200 may be configured to maximize a fraction of diffracted light by the transmit grating coupler 204 through the substrate of the GCL and out to a receive grating coupler of a Si PIC positioned beneath the GCL. A fraction of a light beam travelling through the transmit grating coupler 204 may diffract away from the substrate 206 towards the top surface of the passive section 200, thereby decreasing a coupling efficiency in a direction towards the substrate 206 and into a Si PIC. As such, the top mirror 210 may be deposited on the top cladding 208 to redirect upward diffracted light beams downward through the cladding 206 and into a Si PIC. To ensure the redirected light adds in phase with the light diffracted towards the cladding 206 from the transmit grating coupler 204, a thickness of the top cladding 208 may satisfy equation 4:

$$d = m(\lambda \cos(\theta))/2n_{dielectric},\qquad \text{Equation 4}$$

In equation 4, m is an integer, n is an index of refraction of the top cladding 208, θ is an angle between normal and the propagation direction of the upward diffracted light, and λ is the wavelength of the light beam. In this and other embodiments, inclusion of the top mirror 210 in the passive section 200 may improve a coupling efficiency in the downward direction compared to embodiments that lack the top mirror 210.

Figure 3:
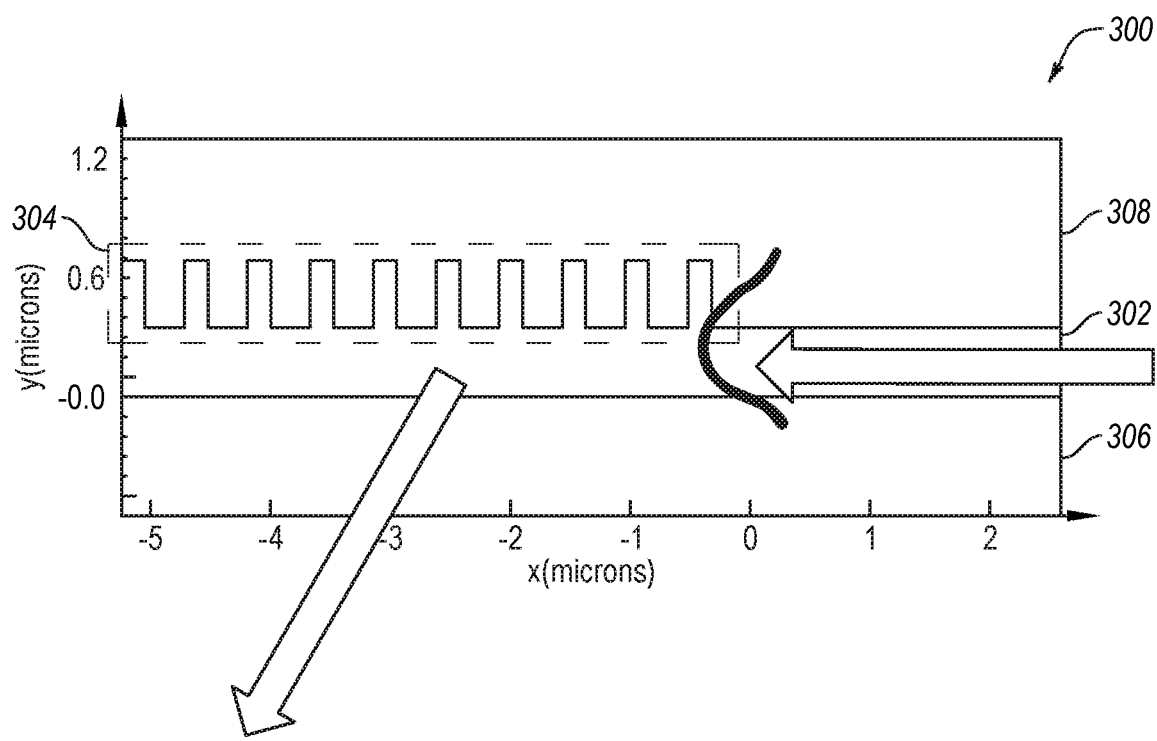
FIG. 3 illustrates a passive section of another example GCL.

FIG. 3 illustrates a passive section 300 of another example GCL, arranged in accordance with at least one embodiment described herein. The passive section 300 may include or correspond to other passive sections described herein. The GCL that includes the passive section 300 of FIG. 3 may be implemented in one or more of the surface coupled systems discussed herein.

The passive section 300 may include a passive waveguide 302 made up of a core and cladding and that is optically coupled to a transmit grating coupler 304, which may respectively correspond to or include the passive waveguides and transmit grating couplers discussed elsewhere herein. The passive section 300 may also include a substrate 306 beneath the passive waveguide 302 and the transmit grating coupler 304, and a top cladding 308 above the passive waveguide 302 and the transmit grating coupler 304. The substrate 306 may serve as cladding to the passive waveguide 302. In at least one embodiment, the passive waveguide 302 may include an InGaAsP waveguide.

In this example, light beams may propagate through the passive waveguide 302 in a right to left direction. The light beams may travel in the passive waveguide 302 until the light beam is diffracted in the direction of the substrate 306 by the transmit grating coupler 304. Some or all of the diffracted light beam may propagate through and out of the substrate 306.

FIG. 3 illustrates an embodiment in which grating teeth of the transmit grating coupler 304 extend upward from a top surface of the passive waveguide 302, and more particularly, upward from a top surface of the core of the passive waveguide 302. As such, the grating teeth of the transmit grating coupler 304 extend to a greater height than the top surface of the passive waveguide 302. In comparison, FIG. 2 illustrates an embodiment in which grating teeth of the transmit grating coupler 204 have a same total height as the passive waveguide 202, and more particularly, of the core of the passive waveguide 202.

In at least one embodiment, the core of the passive waveguide 302 may have a height above the substrate 306 of about 350 nm, such as 300-380 nm, 325-375 nm or 350 nm. Alternatively or additionally, the grating teeth of the transmit grating coupler 304 may have a total height measured from a bottom of the core of the passive waveguide 302 to a top of the grating teeth of the transmit grating coupler 304 of about 650 nm, such as 550-700 nm, 600-680 nm, 650-680 nm, or 673.9 nm. Alternatively or additionally, the grating teeth of the transmit grating coupler 304 may have a height above the core of the passive waveguide 302 measured from a top of the core of the passive waveguide 302 to the top of the grating teeth of the transmit grating coupler 304 of about 300 nm, such as 250-350 nm, 310-330 nm, or 323.9 nm.

The grating teeth of the transmit grating coupler 304 may have a period of 525.6 nm meaning there may be a distance of 525.6 nm between a front of each grating tooth and the front of a subsequent grating tooth. More generally, the grating period may be in a range from 500 nm to 600 nm In an example embodiment, the transmit grating coupler 304 may include 120 grating periods. The duty cycle of the transmit grating coupler 304 may be 0.397, meaning each grating tooth may span 39.7% of each grating period where a corresponding top cladding tooth occupies a remainder of each grating period. More generally, the duty cycle may be in a range from 0.3 to 0.5. In an example embodiment, the transmit grating coupler 304 or other transmit grating couplers described herein may include one or more of the following parameters: 120 grating periods, a grating period of 525.6 nm, a duty cycle of 0.397, a total grating tooth height of 673.9 nm, a downward radiation efficiency (DRE) of −0.454 dB, a radiated diffraction angle $\theta_{rad}$ of −14.24 degrees, a transmission through the transmit grating coupler of about 3.42%, and reflected power of about −53.6 dB. Here DRE is the useful portion of the light that is radiated out to the far field and is defined as the fraction of power radiated out of the diffraction grating towards the substrate in a small angular window about the radiated diffraction angle $\theta_{rad}$.

Figure 4:
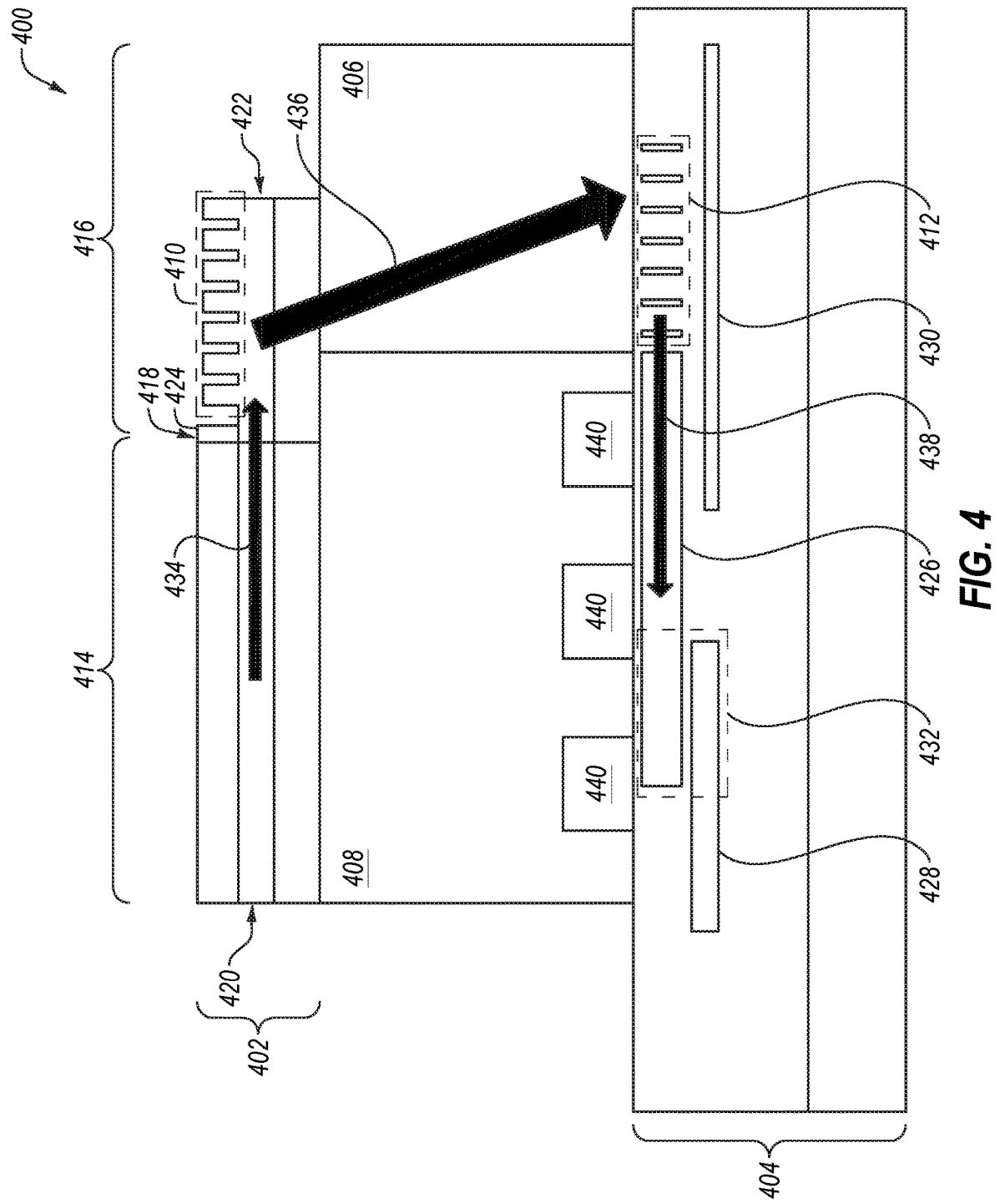
FIG. 4 illustrates another example surface coupled system.

FIG. 4 illustrates another example surface coupled system 400 (hereinafter "system 400"), arranged in accordance with at least one embodiment described herein. As illustrated, the system 400 may include a GCL 402, a PIC 404, an optical isolator 406 (hereinafter "isolator 406"), and/or a submount 408.

The GCL 402 includes a transmit grating coupler 410 while the PIC 404 includes a receive grating coupler 412. In general, the GCL 402 and the PIC 404 may be arranged with the receive grating coupler 412 optically coupled and/or aligned to the transmit grating coupler 410. In some embodiments, the GCL 402 may be aligned with and mechanically mounted directly to the PIC 404 or indirectly to the PIC 404 (e.g., through one or more intervening components).

The GCL 402 may generally include an active section 414 and a passive section 416 that is coupled to the active section to form an interface 418 with the active section 414. The active section 414 includes an active waveguide 420 that may include a laser cavity and gain medium, such as an aluminum gallium indium arsenide (AlGaInAs) or Indium Gallium Arsenide Phosphide (InGaAsP) multiple quantum well (MQW) active region.

The passive section 416 includes a passive waveguide 422, the transmit grating coupler 410, and top cladding 424. The passive waveguide 422 is optically coupled end to end with the active waveguide 420. The passive waveguide 422 includes a first portion and a second portion, the first portion of the passive waveguide 422 positioned between the second portion of the passive waveguide and the active waveguide 420. The transmit grating coupler 410 is optically coupled to the passive waveguide 422. The transmit grating coupler 410 includes grating teeth that extend upward from the second portion of the passive waveguide 422. The top cladding material is positioned directly above the first portion of the passive waveguide and is absent directly above at least some of the transmit grating coupler.

The GCL 402 may additionally include one or more bottom cladding layers, e.g., substrate, beneath the active waveguide 420 and/or beneath the passive waveguide 422 and the transmit grating coupler 410. An antireflection (AR) layer may be formed on a bottom of the bottom cladding layers. The AR layer may reduce and/or eliminate back reflection of light coupled out of the GCL 402 by the transmit grating coupler 410.

The PIC 404 includes the receive grating coupler 412 and a first PIC waveguide 426. The first PIC waveguide 426 may include a SiN waveguide or other waveguide formed in the PIC. The PIC 404 may also include a second PIC waveguide 426 and/or a mirror 430. The second PIC waveguide 426 may include a Si waveguide or other waveguide formed in the PIC above or below the first PIC waveguide 426.

The first PIC waveguide 426 may include an output portion positioned directly above (or below) and adiabatically coupled to an input portion of the second PIC waveguide 428. One or both of the output portion and the input portion may be tapered. The output portion of the first PIC waveguide 426 and the input portion of the second PIC waveguide 428 may thereby form an adiabatic coupler 432. Example adiabatic couplers that may be implemented herein are described in U.S. Pat. No. 9,405,066, which is incorporated herein by reference.

The mirror 430 may be formed beneath the receive grating coupler 412 and/or may include a layer of Si beneath the receive grating coupler 412. The layer of Si may be, e.g., 50 nm thick and/or may be positioned below the receive grating coupler 412 a distance of about 400 nm, or other suitable distance. The mirror 430 may improve directionality of the receive grating coupler 412.

The GCL 402 may be mounted on a simple substrate and individually tested and burned in before assembly on the PIC 404. In an example, the GCL 402 includes an InP GCL mounted on the submount 408, which submount in turn is mounted on the PIC 408. The submount 408 may include Si or AlN or other suitable material. At least a portion of the passive section 416 of the GCL 402 that includes the transmit grating coupler 410 may extend beyond the submount 408, e.g., in a cantilever manner, with the isolator 406 positioned adjacent to the submount 408 and/or between the transmit grating coupler 410 and the receive grating coupler 412.

In operation, light 434 generated in the active section 414 of the GCL 402 may be emitted horizontally and may be coupled out of the GCL 402 in a direction with a vertical component, e.g., through a substrate of the GCL 402, by the transmit grating coupler 410 as light 436. The light 436 may pass through the isolator 406 and may couple directly to the receive grating coupler 412 in the PIC 404 as light 438. The receive grating coupler 412 may include a SiN grating in the PIC 404 that couples the light 438 to the first PIC waveguide 426, e.g., implemented as a SiN waveguide in the PIC 404. The mirror 430 beneath the receive grating coupler 412 may improve directionality of the receive grating coupler 412 as the light 436 is coupled into the PIC 404. Light from the first PIC waveguide 426 may be adiabatically coupled to the second PIC waveguide 428 through the adiabatic coupler 432 with low loss. Parallelism of top and bottom surfaces of the GCL 402, a thin metal bond between the GCL 402 and the submount 408 and mechanical stand-offs 440 in the submount 408 or the PIC 404 may guarantee and/or facilitate a small 0.3° angle assembly tolerance for a relatively large 30 μm laser mode output from the transmit grating coupler 410. A heat sink (not shown) connected to the top of the submount 408 may remove heat from the GCL 402.

Figure 5:
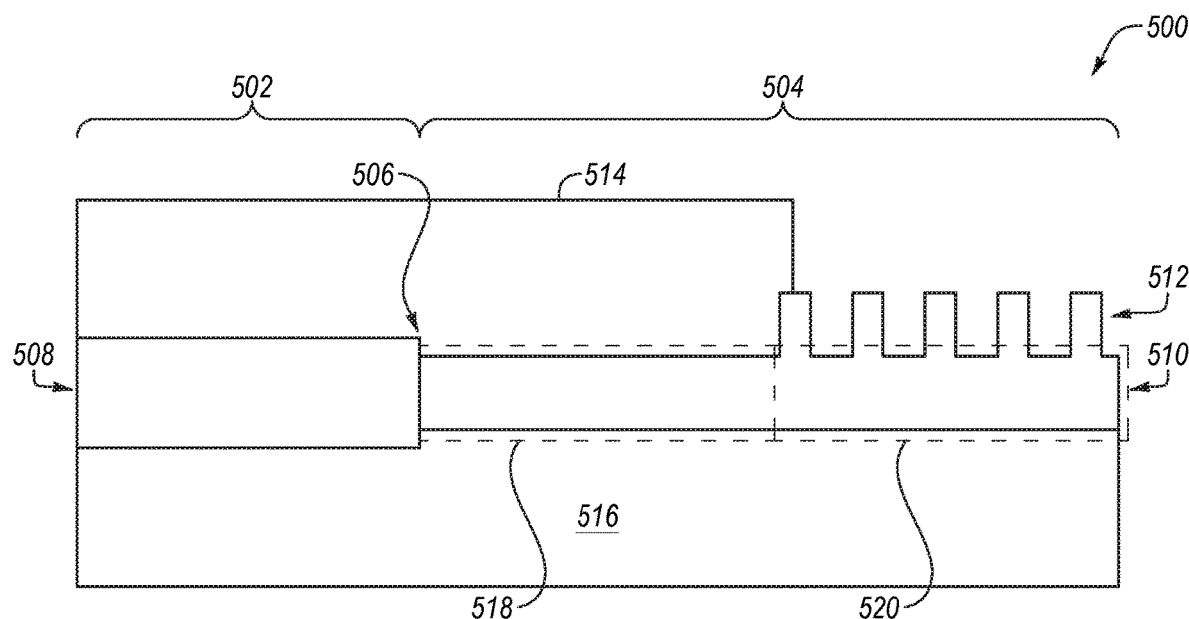
FIG. 5 illustrates an example GCL.

FIG. 5 illustrates an example GCL 500, arranged in accordance with at least one embodiment described herein. The GCL 500 may include or correspond to the GCL 402 of FIG. 4 or other GCLs described herein. As illustrated, the GCL 500 generally includes an active section 502 and a passive section 504 that is coupled to the active section 502 to form an interface 506 with the active section 502. The active section 502 includes an active waveguide 508 that may include a laser cavity and gain medium, such as an InGaAsP or AlGaInAs MQW active region.

The passive section 504 includes a passive waveguide 510, a transmit grating coupler 512, top cladding 514, and bottom cladding/substrate 516. The passive waveguide 510 is optically coupled end to end with the active waveguide 508. The passive waveguide 510 includes a first portion 518 and a second portion 520. The first portion 518 of the passive waveguide 510 is positioned between the second portion 520 of the passive waveguide 510 and the active waveguide 508. The transmit grating coupler 512 is optically coupled to the passive waveguide 510. The transmit grating coupler 512 includes grating teeth that extend upward from the second portion 520 of the passive waveguide 510, but not from the first portion 518 of the passive waveguide 510.

The top cladding 514 is positioned directly above the first portion 518 of the passive waveguide 518 and is absent directly above at least some of the transmit grating coupler 512 and directly above at least some of the second portion 520 of the passive waveguide 510. In particular, the top cladding 514 in FIG. 5 is positioned directly above a portion of one or more of the grating teeth of the transmit grating coupler 512 that are closest to the first portion 518 of the passive waveguide 510 and is absent directly above the remaining grating teeth of the transmit grating coupler 512. The top cladding 514 may include an InP top cladding, an intrinsic or lightly p-doped top cladding, or other suitable top cladding.

The passive waveguide 510 may be butt coupled to the active waveguide 508 to form a butt joint as the interface 506. Butt coupling the passive and active waveguides 510, 508 may be accomplished by, e.g., growing one or more layers of the active waveguide 508 on the substrate 516 in both the active section 502 and the passive section 504, etching away the layers of the active waveguide 508 within the passive section 504 down to the substrate 516, and then regrowing one or more layers of the passive waveguide 510 on the substrate. The passive waveguide 510 may be grown to a height of the teeth of the transmit grating coupler 512 and then portions may be etched away to form the teeth of the transmit grating coupler 512.

The layers of the active waveguide 508 may include, e.g., one or more quantum well layers, one or more spacer layers, and one or more barrier layers.

The cladding 514, such as a cladding of InP, may be grown on both the active waveguide 508 and the passive waveguide 510. A mask may be applied to the transmit grating coupler 512 except a portion of the first tooth to avoid growing the cladding 514 on the remainder of the transmit grating coupler 512, following which the mask may be removed.

A passivation layer or cladding layer (not shown) of a different material than the cladding 514 may be formed on the transmit grating coupler 512 and the passive waveguide 510 where the top cladding 514 is absent directly above the transmit grating coupler 512 and the passive waveguide 510. The passivation layer or cladding layer may include $SiO_2$, SiN, or other suitable passivation layer.

As illustrated in FIG. 5, the active waveguide 508 and the passive waveguide 510, and more particularly a core of the active waveguide 508 and a core of the passive waveguide 510, may have different cross-sectional areas at the interface 506. For example, the passive waveguide 510 may be thinner than the active waveguide 508 as illustrated, or vice versa. Stated another way, the active waveguide 508 (more particularly, the core of the active waveguide 508) may have a first cross-sectional area orthogonal to a length (left and right in FIG. 5) of the active waveguide 508 at the interface 506 that is different than a second cross-sectional area orthogonal to a length (left and right in FIG. 5) of the passive waveguide 510 (more particularly, the core of the passive waveguide 510) at the interface 506. In the example of FIG. 5, the first cross-sectional area of the active waveguide 508 at the interface 506 may be greater than the second cross-sectional area of the passive waveguide 510 at the interface 506. Even so, the cross-sectional area of the passive waveguide 510 may increase moving away from the interface 506, e.g., in a fan out region of the passive waveguide 510 that includes the transmit grating coupler 512.

Alternatively or additionally, the passive waveguide 510 may have a similar mode size as the active waveguide 508. For example, the mode size of the passive waveguide 510 may be within 15%, 10%, or 5% of the mode of the active waveguide 508.

Figure 6:
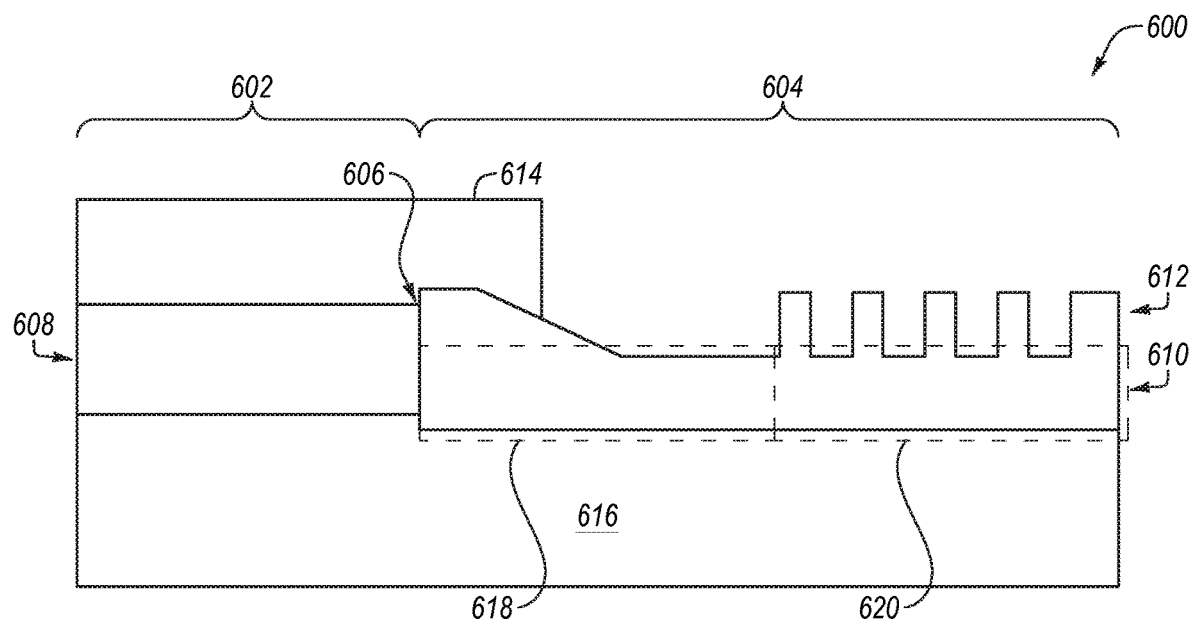
FIG. 6 illustrates another example GCL.

FIG. 6 illustrates another example GCL 600, arranged in accordance with at least one embodiment described herein. The GCL 600 may include or correspond to the GCL 402 of FIG. 4 or other GCLs described herein. As illustrated, the GCL 600 generally includes an active section 602 and a passive section 604 that is coupled to the active section 602 to form an interface 606 with the active section 602. The active section 602 includes an active waveguide 608 that may include a laser cavity and gain medium, such as an InGaAsP or AlGaInAs MQW active region.

The passive section 604 includes a passive waveguide 610, a transmit grating coupler 612, top cladding 614, and bottom cladding/substrate 616. The passive waveguide 610 is optically coupled end to end with the active waveguide 608. The passive waveguide 610 includes a first portion 618 and a second portion 620. The first portion 618 of the passive waveguide 610 is positioned between the second portion 620 of the passive waveguide 610 and the active waveguide 608. The transmit grating coupler 612 is optically coupled to the passive waveguide 610. The transmit grating coupler 612 includes grating teeth that extend upward from the second portion 620 of the passive waveguide 610, but not from the first portion 618 of the passive waveguide 610.

The top cladding 614 is positioned directly above some of the first portion 618 of the passive waveguide 618 and is absent directly above at least some of the transmit grating coupler 612 and directly above at least some of the second portion 620 of the passive waveguide 610. In particular, the top cladding 614 in FIG. 6 is completely absent above the grating teeth of the transmit grating coupler 612. The top cladding 614 in FIG. 6 is also absent directly above at least some of the first portion 618 of the passive waveguide 610. The top cladding 614 may include an InP top cladding, an intrinsic or lightly p-doped top cladding, or other suitable top cladding.

In this and other embodiments, a core of the passive waveguide 610 may be sufficiently thick, e.g., may have a sufficiently large cross-sectional area, following the interface 606 that light may be substantially confined in the core of the passive waveguide 610. In this and other embodiments, the cladding 614 may be terminated in a tapered region of the passive waveguide 610, e.g., where the core of the passive waveguide 610 is still relatively thick and the light is substantially confined in the core, which may reduce loss at the cladding termination interface. Light may be substantially confined in the core if, e.g., 85%, 90%, or 95% of the light mode is within the core.

The passive waveguide 610 may be butt coupled to the active waveguide 608 to form a butt joint as the interface 606. Butt coupling the passive and active waveguides 610, 608 may be accomplished as described elsewhere herein.

A passivation layer or cladding layer (not shown) of a different material than the cladding 614 may be formed on the transmit grating coupler 612 and the passive waveguide 610 where the top cladding 614 is absent directly above the transmit grating coupler 612 and the passive waveguide 610. The passivation layer or cladding layer may include $SiO_2$, SiN, or other suitable passivation layer.

As illustrated in FIG. 6, the active waveguide 608 and the passive waveguide 610, and more particularly a core of the active waveguide 608 and a core of the passive waveguide 610, may have different cross-sectional areas at the interface 606. For example, the passive waveguide 610 may be thicker than the active waveguide 610 as illustrated, or vice versa. Stated another way, the active waveguide 608 (more particularly, the core of the active waveguide 608) may have a first cross-sectional area orthogonal to a length (left and right in FIG. 6) of the active waveguide 608 at the interface 606 that is different than a second cross-sectional area orthogonal to a length (left and right in FIG. 6) of the passive waveguide 610 (more particularly, the core of the passive waveguide 610) at the interface 606. In the example of FIG. 6, the first cross-sectional area of the active waveguide 608 at the interface 606 may be less than the second cross-sectional area of the passive waveguide 610 at the interface 606. The cross-sectional area of the passive waveguide 610 may decrease, at least initially, in a tapered region of the passive waveguide 610 moving away from the interface 606 before then increasing, e.g., in a fan out region of the passive waveguide 610 that includes the transmit grating coupler 612. The passive waveguide 610 may taper vertically and/or laterally in the taper region moving away from the interface 606.

Figure 7:
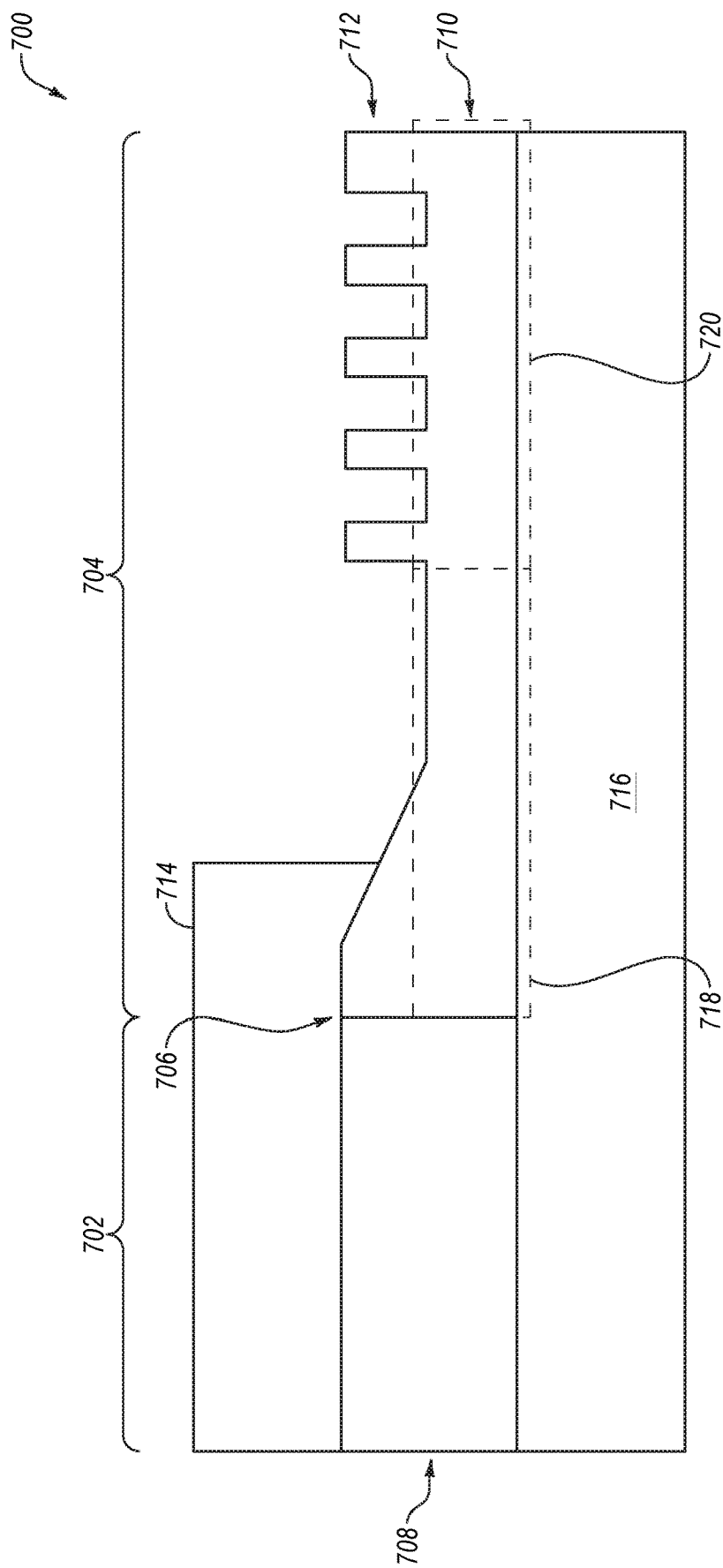
FIG. 7 illustrates another example GCL, all arranged in accordance with at least one embodiment described herein.

FIG. 7 illustrates another example GCL 700, arranged in accordance with at least one embodiment described herein. The GCL 700 may include or correspond to the GCL 402 of FIG. 4 or other GCLs described herein. As illustrated, the GCL 700 generally includes an active section 702 and a passive section 704 that is coupled to the active section 702 to form an interface 706 with the active section 702. The active section 702 includes an active waveguide 708 that may include a laser cavity and gain medium, such as an InGaAsP or AlGaInAs MQW active region.

The passive section 704 includes a passive waveguide 710, a transmit grating coupler 712, top cladding 714, and bottom cladding/substrate 716. The passive waveguide 710 is optically coupled end to end with the active waveguide 708. The passive waveguide 710 includes a first portion 718 and a second portion 720. The first portion 718 of the passive waveguide 710 is positioned between the second portion 720 of the passive waveguide 710 and the active waveguide 708. The transmit grating coupler 712 is optically coupled to the passive waveguide 710. The transmit grating coupler 712 includes grating teeth that extend upward from the second portion 720 of the passive waveguide 710, but not from the first portion 718 of the passive waveguide 710.

The top cladding 714 is positioned directly above some of the first portion 718 of the passive waveguide 718 and is absent directly above at least some of the transmit grating coupler 712 and directly above at least some of the second portion 720 of the passive waveguide 710. In particular, the top cladding 714 in FIG. 7 is completely absent above the grating teeth of the transmit grating coupler 712. The top cladding 714 in FIG. 7 is also absent directly above at least some of the first portion 718 of the passive waveguide 710.

The top cladding 714 may include an InP top cladding, an intrinsic or lightly p-doped top cladding, or other suitable top cladding.

In this and other embodiments, a core of the passive waveguide 710 may be sufficiently thick, e.g., may have a sufficiently large cross-sectional area, following the interface 706 that light may be substantially confined in the core of the passive waveguide 710. In this and other embodiments, the cladding 714 may be terminated in a tapered region of the passive waveguide 710, e.g., where the core of the passive waveguide 710 is still relatively thick and the light is substantially confined in the core, which may reduce loss at the cladding termination interface. Light may be substantially confined in the core if, e.g., 85%, 90%, or 95% of the light mode is within the core.

The passive waveguide 710 may be formed of the same material layers as the active waveguide 708 using quantum well intermixing (QWI). In QWI, the layers that form the active waveguide 708, including a MQW and/or barrier layers, are also used to form the passive waveguide 710 in the same material deposition step(s). A buffer may then be formed on the MQW/barrier layers. A mask or pattern may be formed on the buffer layer where areas above the MQW layer that are to remain active are covered by the mask and areas above the MQW layer that are to change to passive are not covered by the mask. An ion implantation step is then performed to introduce ions in the buffer layer in areas not covered by the mask. A rapid thermal annealing (RTA) step then causes ions from the buffer layer in areas not covered by the mask to penetrate the MQW layer, which shifts the bandgap of the MQW layer in these areas and makes the MQW layer in these areas transparent to the lasing wavelength of the active region(s) (e.g., those areas covered by the mask). A portion of an active waveguide that has been converted to a passive waveguide by QWI may be referred to herein as a QWI waveguide. After completing the QWI process to form the passive waveguide, e.g., the QWI waveguide, the cladding 714 may be formed on the active waveguide 708 and on at least some of the first portion 718 of the passive waveguide 710.

A passivation layer or cladding layer (not shown) of a different material than the cladding 714 may be formed on the transmit grating coupler 712 and the passive waveguide 710 where the top cladding 714 is absent directly above the transmit grating coupler 712 and the passive waveguide 710. The passivation layer or cladding layer may include $SiO_2$, SiN, or other suitable passivation layer.

The active waveguide 708 and the passive waveguide 710, and more particularly a core of the active waveguide 708 and a core of the passive waveguide 710, may have the same or different cross-sectional areas at the interface 706. The cross-sectional area of the passive waveguide 710 may decrease, at least initially, in a tapered region of the passive waveguide 710 moving away from the interface 706 before then increasing, e.g., in a fan out region of the passive waveguide 710 that includes the transmit grating coupler 712. The passive waveguide 710 may taper vertically and/or laterally in the taper region moving away from the interface 706.

Alternatively or additionally, a core of the passive waveguide 710 may be sufficiently thick, e.g., may have a sufficiently large cross-sectional area, following the interface 706 that light may be substantially confined in the core of the passive waveguide 710. In this and other embodiments, the cladding 714 may be terminated in the tapered region of the passive waveguide 710, e.g., where the core of the passive waveguide 710 is still relatively thick and the light is substantially confined in the core, which may reduce loss at the cladding termination interface.

QWI may be implemented in either or both of the embodiments of FIGS. 5 and 6 or variations thereof. For example, FIG. 7 is similar to FIG. 6 except that FIG. 7 implements QWI rather than butt-coupling to form the passive waveguide 710 and the cross-sectional areas of the active and passive waveguides 708, 710 at the interface 706 are illustrated as the same. Analogously, the embodiment of FIG. 5 may be implemented where the passive waveguide 510 is formed by QWI intermixing rather than butt-coupling and/or the active and passive waveguides 508, 510 may have the same cross-sectional area at the interface 506.

GCLs with passive waveguides formed by QWI rather than butt coupling may have lower loss than GCLs with passive waveguides formed by butt coupling. In particular, because the passive waveguide as a QWI waveguide is formed from the same material layers as the active waveguide, rather than by etching and regrowth, there is no gap at the interface between the active waveguide and the passive waveguide, thereby eliminating or at least reducing loss associated with crossing the butt joint.

Unless specific arrangements described herein are mutually exclusive with one another, the various implementations described herein can be combined to enhance system functionality and/or to produce complementary functions. Such combinations will be readily appreciated by those skilled in the art given the totality of the foregoing description. Likewise, aspects of the implementations may be implemented in standalone arrangements where more limited and thus specific component functionality is provided within each of the interconnected and therefore interacting—system components albeit that, in sum, they together support, realize and produce the described real-world effect(s). Indeed, it will be understood that unless features in the particular implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will, therefore, be appreciated that the above description has been given by way of example only and that modification in detail may be made within the scope of the present invention.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as "an aspect" may refer to one or more aspects and vice versa. A phrase such as "an embodiment" or "an implementation" does not imply that such embodiment or implementation is essential to the subject technology or that such embodiment or implementation applies to all configurations of the subject technology. A disclosure relating to an embodiment or implementation may apply to all embodiments or implementations, or one or more embodiments or implementations. An embodiment or implementation may provide one or more examples of the disclosure. A phrase such as "an embodiment" or "an implementation" may refer to one or more embodiments or implementations and vice versa. A phrase such as "a configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as "a configuration" may refer to one or more configurations and vice versa.

A reference to an element in the singular is not intended to mean "one and only one" unless specifically stated, but rather "one or more." Pronouns in the masculine (e.g., his) include the feminine and neuter gender (e.g., her and its) and vice versa. The term "some" refers to one or more. Moreover, nothing disclosed herein is intended to be dedicated to the public regardless of whether such disclosure is explicitly recited in the above description.

The present disclosure is not to be limited in terms of the particular implementations described herein, which are intended as illustrations of various aspects. Many modifications and variations can be made without departing from its spirit and scope. Functionally equivalent methods and apparatuses within the scope of the disclosure, in addition to those enumerated herein, are possible from the foregoing descriptions. Such modifications and variations are intended to fall within the scope of this disclosure. Also, the terminology used herein is for the purpose of describing particular implementations only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, and/or A, B, and C together, etc.).

In those instances where a convention analogous to "at least one of A, B, or C, etc." is used, in general, such a construction is intended in the sense one having skill in the art would understand the convention (e.g., "a system having at least one of A, B, or C" would include but not be limited to systems that include A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

For any and all purposes, such as in terms of providing a written description, all ranges disclosed herein also encompass any and all possible sub ranges and combinations of sub ranges thereof. Any listed range can be easily recognized as sufficiently describing and enabling the same range being broken down into at least equal halves, thirds, quarters, fifths, tenths, and/or others. As a non-limiting example, each range discussed herein can be readily broken down into a lower third, middle third and upper third, etc. All language such as "up to," "at least," and the like include the number recited and refer to ranges which can be subsequently broken down into sub ranges as discussed above. Finally, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system comprising:
   a grating coupled laser (GCL), the GCL comprising:
      a substrate that has a bottom and a top;
      an active section positioned above the top of the substrate and being configured to generate light; and
      a passive section positioned above the top of the substrate and coupled to the active section to form an interface with the active section,
      wherein the active section includes an active waveguide, the active waveguide having a first cross-sectional area orthogonal to a first length of the active waveguide, wherein the passive section includes:
         (i) a passive waveguide optically coupled end to end with the active waveguide and being configured to transmit the light from the active waveguide in a first horizontal direction, the passive waveguide including a first portion and a second portion, the first portion of the passive waveguide positioned between the second portion of the passive waveguide and the active waveguide, the passive waveguide having a second cross-sectional area orthogonal to a second length of the passive waveguide, the second cross-sectional area of the first portion being greater at the interface than the second cross-sectional area of the second portion, the second cross-sectional area of the first portion at the interface being greater than the first cross-sectional area of the active waveguide;
         (ii) a transmit grating coupler optically coupled to the passive waveguide, the transmit grating coupler including a plurality of grating teeth that extend upward from the second portion of the passive waveguide, the transmit grating coupler being configured to transmit the light from the passive waveguide in a direction having a vertical component, the passive waveguide comprising a tapered region that tapers inward in a vertical direction moving from the interface at the first portion toward the transmit grating coupler at the second portion such that the second cross-sectional area of the passive waveguide decreases moving from the interface at the first portion toward the transmit grating coupler at the second portion in the tapered region; and
         (iii) a top cladding that is positioned directly above the first portion of the passive waveguide, the top cladding terminating at a termination within the tapered region such that the top cladding is positioned directly above a part of the tapered region of the passive waveguide and is completely absent above the second portion of the tapered region of the passive waveguide;
   a photonic integrated circuit (PIC) comprising a PIC waveguide and a receive grating coupler, the receive grating coupler optically coupled to the PIC waveguide, the PIC waveguide disposed underneath the grating coupled laser, the receive grating coupler being configured to receive the light from the transmit grating coupler and being configured to transmit the light in a second horizontal direction opposite to the first horizontal direction;
   a sub-mount mounted on the PIC, the sub-mount having a portion of the bottom of the substrate of the GCL mounted thereon such that the GCL is configured to be individually tested and burned in before assembly on the PIC, the transmit grating coupler of the GCL extending beyond the sub-mount; and
   an optical isolator mounted on the PIC adjacent the sub-mount and having a portion of the GCL mounted thereon, the optical isolator positioned between the transmit grating coupler of the GCL and the receive grating coupler of the PIC, the receive grating coupler being optically coupled to the transmit grating coupler through the optical isolator.

2. The system of claim 1, wherein the passive waveguide comprises a quantum well intermixing (QWI) waveguide.

3. The system of claim 1, wherein the passive waveguide comprises a same quantum well layer as the active waveguide, wherein the quantum well layer in the passive waveguide has a shifted bandgap relative to the quantum well layer in the active waveguide such that the passive waveguide is transparent to a lasing wavelength of the active waveguide.

4. The system of claim 1, further comprising a passivation layer formed on the transmit grating coupler.

5. The system of claim 4, wherein the top cladding comprises a p-doped top cladding and wherein the passivation layer comprises silicon dioxide ($SiO_2$) or silicon nitride (SiN).

6. The system of claim 1, wherein:
a core of the active waveguide has the first cross-sectional area orthogonal to the first length of the active waveguide at the interface;
a core of the passive waveguide has the second cross-sectional area orthogonal to the second length of the passive waveguide at the interface; and
the first cross-sectional area of the core of the active waveguide is greater than the second cross-sectional area of the core of the passive waveguide.

7. The system of claim 6, wherein:
the system further comprises a mirror positioned beneath the receive grating coupler; the mirror comprises a layer of silicon positioned beneath the receive grating coupler; the PIC waveguide comprises a silicon nitride waveguide;
the PIC further comprises a silicon waveguide have an input portion positioned directly beneath an output portion of the silicon nitride waveguide, the input portion of the silicon waveguide and the output portion of the silicon nitride waveguide forming an adiabatic coupler;
an optical mode size of each of the transmit grating coupler and the receive grating coupler is between 20 to 40 micrometers;
the system further comprises the submount coupled between the GCL and the PIC, the GCL coupled to a top surface of the submount and the submount coupled to a top surface of the PIC;
a portion of the GCL extends beyond the submount; and
the optical isolator is positioned adjacent to the submount and between the GCL and the PIC.

8. The system of claim 1, further comprising a mirror positioned beneath the receive grating coupler.

9. The system of claim 8, wherein the mirror comprises a layer of silicon positioned beneath the receive grating coupler.

10. The system of claim 1, wherein the PIC waveguide comprises a silicon nitride waveguide, the PIC further comprising a silicon waveguide having an input portion positioned directly beneath an output portion of the silicon nitride waveguide, the input portion of the silicon waveguide and the output portion of the silicon nitride waveguide forming an adiabatic coupler.

11. The system of claim 10, further comprising a passivation layer formed on the transmit grating coupler, wherein the top cladding comprises a p-doped top cladding and wherein the passivation layer comprises silicon dioxide ($SiO_2$) or silicon nitride (SiN).

12. The system of claim 1, wherein an optical mode size of each of the transmit grating coupler and the receive grating coupler is between 20 to 40 micrometers.

13. The system of claim 1, wherein the submount is coupled between the GCL and the PIC, the GCL coupled to a top surface of the submount and the submount coupled to a top surface of the PIC.

14. The system of claim 13, wherein a portion of the GCL extends beyond the submount; and wherein the optical isolator is positioned adjacent to the submount and between the GCL and the PIC.

15. The system of claim 1, wherein the passive waveguide comprises a same quantum well layer as the active waveguide, wherein the quantum well layer in the passive waveguide has a shifted bandgap relative to the quantum well layer in the active waveguide such that the passive waveguide is transparent to a lasing wavelength of the active waveguide.

16. The system of claim 15, further comprising a passivation layer formed on the transmit grating coupler.

* * * * *